United States Patent [19]

Schaible et al.

[11] 4,352,716
[45] Oct. 5, 1982

[54] DRY ETCHING OF COPPER PATTERNS

[75] Inventors: Paul M. Schaible; Geraldine C. Schwartz, both of Poughkeepsie, N.Y.

[73] Assignee: International Business Machines Corporation, Armonk, N.Y.

[21] Appl. No.: 219,645

[22] Filed: Dec. 24, 1980

[51] Int. Cl.³ .............................................. C23F 1/02
[52] U.S. Cl. ................................... 156/643; 156/646; 156/661.1; 156/666; 156/904; 204/192 E; 427/259; 427/272; 427/88; 427/126.3; 428/701; 428/702; 428/632; 428/663; 428/471; 428/472; 427/126.4
[58] Field of Search ...................... 156/643, 666, 661.1, 156/659.1, 904, 646, 656; 430/314, 318; 427/259, 272, 88, 126.3, 126.4; 428/701, 702, 632, 663, 471, 472; 204/192 E

[56] References Cited

U.S. PATENT DOCUMENTS

| Re. 29,947 | 3/1979 | Van Ommeren | 204/192 E |
| 3,386,159 | 6/1968 | Milch et al. | 428/632 X |
| 4,007,037 | 2/1977 | Lukes et al. | 75/117 |
| 4,026,742 | 5/1977 | Fujino | 156/643 |
| 4,057,460 | 11/1977 | Saxena et al. | 156/643 |
| 4,092,442 | 5/1978 | Agnihotri et al. | 427/41 |
| 4,132,586 | 1/1979 | Schaible et al. | 156/643 |
| 4,172,004 | 10/1979 | Alcorn et al. | 156/643 |

Primary Examiner—George F. Lesmes
Assistant Examiner—Alexander S. Thomas
Attorney, Agent, or Firm—Henry Powers

[57] ABSTRACT

The use of a molybdenum diffusion barrier between a copper layer and a magnesium oxide dry etch mask to obtain and insure adhesion between the two.

34 Claims, 11 Drawing Figures

BEFORE RIE: MgO MASKED SPUTTERED COPPER
WITH Mo BARRIER BENEATH MgO

AFTER RIE

DRY ETCHING OF COPPER PATTERNS

DESCRIPTION

Technical Field

This invention relates to the fabrication of semiconductor components, and more particularly to the formation of copper surface metallurgy on components such as semiconductor or dielectric substrates employed in the fabrication and packaging of semiconductor components. More specifically, the invention is directed to the formation of copper patterns by selective removal thereof from a substrate by dry etching techniques using substantially inert masking patterns.

One object of the present invention is to provide an improved process for etching patterns in copper films.

Another object of the present invention is to provide an improved masking technique for dry etching of copper patterns from films thereof.

Another object of the present invention is to provide an improved structure for dry etching of copper patterns from films thereof formed on supporting substances.

Another object of the present invention is to provide an improved dry etching technique for forming copper interconnect metallurgy for sintered multi-layered dielectric structures having a multi-level conductor patterns embedded therein.

Another object of the present invention is to provide a reactive ion etching technique for forming copper interconnect metallurgy on a multi-layered glass ceramic substrate having multi-level copper patterns embedded therein.

Background Art

Dry etching techniques are employed in the fabrication of semiconductor components with increasing frequency as the circuit densities increase. As the circuit densities increase, the metal interconnection lines must become narrower and more closely spaced, with corresponding increase in the thickness of the lines in order to have sufficient current carrying capacity.

These requirements cannot be met if conventional chemical subtractive etching is used to define the metal patterns and, as a result, in recent years interest in dry etching techniques has been increasing for forming metallization patterns in integrated circuit. Certain dry etching processes are employed where it is required that the walls of the etched pattern be vertical. Such directional etching processes involve ion bombardment and/or ion assisted chemical reactions: rf sputter etching, ion beam milling, and reactive ion etching (sometimes called reactive sputter etching or reactive ion sputtering). All these use gas plasmas excited by the application of a radio frequency voltage; the frequency range of 13.56 to 40.63 MHz is used most commonly, but other frequencies can be employed.

Another dry process, reactive plasma etching, is used to avoid wet processing and minimize mask undercut. This process involves free radical chemical etching and is isotropic. The free radicals are generated in a plasma excited by the application of a radio frequency voltage, usually either 50 KHz or 13.56 MHz, but other rf frequencies can be used; microwave excitation has also been employed.

Such processes are used for etching of metallization interconnection patterns, contact or via holes in $SiO_2$, $Si_3N_4$, polyimide, and the like, and also for etching deep grooves or moats in silicon for isolation, and for etching deep holes in silicon or silicon dioxide for ink jet applications, and the like.

In these dry etching systems, the surface to be etched is covered with a suitable mask, and placed in the dry etching environment. In directional etching processes, in order to obtain the vertical side walls, especially when small dimensions and/or deep etching are required, the etch mask must meet several requirements, e.g. it must not etch at an appreciable rate, it must not cause formation of back-scattered residue, it must not degrade in the plasma, it must not flow or deform at elevated temperatures which can exist either because of ion bombardment or need for elevated temperature to increase the volatility of reaction products of plasma reactions, it must be reproducibly of uniform thickness across the pattern to prevent edge degradation. In plasma etching, all of the above requirements, except those concerned with the effects of ion bombardment, must also be met. Also, where small dimensions are required, the masking technique should also be compatible with E-beam lithography. In addition, the mask must be capable of being completely removed without attack of the etched pattern or the underlying substrate. Also, for usefulness in commercial manufacturing processes, the removal of the mask should be accomplished in a relatively short time, and preferably in a non-corrosive environment.

One specific application of these dry etching techniques in the fabrication of semiconductor components is for the reactive ion etching of copper surface metallurgy on dielectric substrate carriers for integrated circuit devices, as for example the sintered glass-ceramic substrate of U.S. Pat. No. 4,234,367, issued Nov. 18, 1980 to L. W. Herron et al., which contains an embedded multi-level array of copper conductor patterns.

To meet the design requirements for very dense packaging, the copper surface interconnections must be made of relatively thick metal, and the lines and spaces (of the interconnect pattern) must be relatively narrow. The adaptability of reactive ion etching (RIE) of the copper pattern is an apparent obvious solution to the problem. However, it is not immediately obvious how copper can be reactively ion etched. Copper is relatively unreactive in the reactive ion etching atmosphere or environment. Also, magnesium oxide (MgO) and aluminum oxide ($Al_2O_3$), the masks of choice because of the thickness of the copper films to be etched, do not adhere to copper. With respect to use of MgO masking, attention is directed to the P. M. Schaible et al U.S. Pat. No. 4,132,586 granted Jan. 2, 1979.

The use of resist masking, for reactive ion etching of copper, is not suitable because the resist films would have to be very thick because of their relatively high etch rate ratio with respect to copper, and also because copper is very susceptable to destructive oxidation during ashing required for resist removal. As is known plasma-hardened resist is extremely difficult to remove in solvents.

Also, for reactive ion etching of copper, high power densities, high cathode temperatures and the use of $CCl_4/Ar$ plasma are, all, required to etch copper cleanly.

Since copper does not form a protective oxide, it would be expected that any chlorine containing plasma would be suitable for forming the slightly volatile reaction products. However, the use of Cl$_2$/Ar plasma does not result in clean etching.

At low power densities, CCl$_4$/Ar plasmas produce a black smut on the surface of the copper during RIE, making end-point detection impossible or at the very least extremely difficult. Although it is known that ion bombardment is chiefly responsible for heating the substrates, at low cathode temperatures, the reactive ion etch rates are very low, even at high power densities. Therefore, to reactive ion etch copper at an acceptable high rate, forming clean patterns, to a detectable end-point, the combination of a CCl$_4$ containing plasma, high power density ($\geq 1.3$ W/cm$^2$) and elevated cathode temperature ($\geq 225°$ C.) is necessary.

In conjunction with the foregoing, attention is also directed to the following art for background information.

U.S. Pat. No. 4,007,037 issued on Feb. 8, 1977 to R. M. Likes et al and titled "Composition and Method for Chemically Etching Copper Elements".

U.S. Pat. No. 4,026,742 issued May 31, 1977 to K. Fujino and titled "Plasma Etching Process for Making a Microcircuit Device".

U.S. Pat. No. 4,057,460 issued Nov. 8, 1977 to A. N. Saxena et al, and titled "Plasma Etching Process".

U.S. Pat. No. 4,092,210 issued May 30, 1978 to J. Hoepfner, and titled "Process for the Production of Etched Structures in a Surface of a Solid Body Ionic Etching".

U.S. Pat. No. 4,092,442 issued May 30, 1978 to R. Kumar et al, and titled "Method of Depositing Thin Films Utilizing a Polyimide Mask".

U.S. Pat. No. 4,130,454 issued Dec. 19, 1978 to O. B. Dutkewych et al, and entitled "Etchant and Process of Etching with Same".

U.S. Pat. No. 4,172,004 issued Oct. 23, 1979 to G. E. Alcorn et al and entitled "Method for Forming Dense Dry Etched Multi-Level Metallurgy with Non-Overlapped Vias".

U.S. Pat. No. Re. 29,947 reissued Mar. 27, 1979 to O. V. Ommeren and titled "Semiconductor Pattern Delineation by Sputter Etching Process".

The IBM-Technical Disclosure Bulletin article "Sputter Etching Process" by W. E. Mutter, p. 884, September 1970, vol. 13, no. 4.

BRIEF DESCRIPTION OF DRAWINGS

In the accompanying drawings forming a material part of this disclosure

FIGS. 1A to 1J are diagramatical cross-sectional views of a structure as well as various steps during its fabrication in accordance with this invention, as well as a flow chart describing the steps.

DISCLOSURE OF INVENTION

Figure 1A:
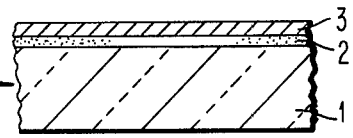
Figure 1B:
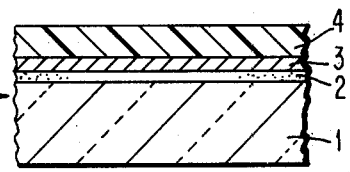

On finding that films of magnesium oxide (MgO) and aluminum oxide (Al$_2$O$_3$) do not adhere to copper for purposes of masking thereof for reactive ion etching, various adhesion promoting films (e.g. aluminum and chromium) to which the magnesium and aluminum oxides adhered were tried. However, because of the high temperatures involved in reactive ion etching of copper, the copper was found to diffuse through the adhesion promoting layers, during RIE, lifting the mask during the etching cycle and exposing the copper to attack.

However, it was found, in accordance with this invention, that the application of a thin molybdenum layer as an adhesion promoting film between copper and the MgO or Al$_2$O$_3$ masking material enables the successful and accurate reactive ion etching of copper with required accuracy of pattern definition. In such application the molybdenum forms with the MgO and Al$_2$O$_3$ masking material a composite Mo/oxide mask. The molybdenum film acts, during the dry etching, as a diffusion barrier for the copper. Since the masking materials magnesium oxide (MgO) and aluminum oxide (Al$_2$O$_3$) adhere to the molybdenum, the masking materials can be applied directly to the surfaces of the molybdenum films.

The masking pattern can be formed in the composite Mo/oxide mask by substractive etching. Thin layers of the molybdenum and the oxide can be sequentially deposited on a copper film. The desired pattern is defined in an appropriate resist by either optical or E-beam lithography. The unmasked portions of the composite Mo/oxide mask regions are suitably etched (e.g. sequentially in ammonia oxalate for MgO and alkaline ferricyanide for Mo), and the resist removed in the usual way.

Preferably, the composite Mo/oxide mask can be formed by sequential deposition through openings of a suitable lift-off mask which is subsequently removed, together with undesired portions of the Mo/oxide mask.

In accordance with this invention, for purposes of fabricating semiconductor components, a blanket layer of copper based metal is deposited, as by evaporation or sputtering, onto a substrate. Where adhesion problems are encountered, as for example, where the substrate is comprised of a multi-layered glass-ceramic such as described in the aforesaid patent U.S. Pat. No. 4,234,367, the copper may be preceded by blanket deposition of a compatible adhesion promoter, such as titanium. After deposition of the copper it can then be overcoated with an organic polymer blanket layer, such as an appropriate resist, followed by exposure and development, using appropriate photo or electron beam lithographic techniques, to provide a pattern of openings of the desired conductor pattern. Blanket layers of Mo and MgO or Al$_2$O$_3$ are then sequentially deposited by evaporation over the retained resist and exposed copper layer, followed by removal of the remainder of the resist together with its overcoatings of Mo and oxide in a suitable solvent. This leaves behind a composite Mo/oxide mask corresponding to the desired metallization pattern. The exposed copper in the openings of the composite Mo/oxide mask is then removed by dry etching techniques (e.g. reactive ion etching), followed by removal of the MgO and Mo in suitable solvents. For example, the MgO may be removed first in a suitable solvent such as a solution of oxalic acid, ammonia oxalate, acetic acid, and the like, while the molybdenum can be removed by an alkaline ferricyanide solution.

DESCRIPTION OF A PREFERRED EMBODIMENT

With reference to FIG. 1A, the substrate 1 can comprise, for purposes of illustration, a glass-ceramic structure having a multi-layer distribution of conductors which serve as a carrier for mounting of semiconductor devices, as described in the aforesaid U.S. Pat. No. 4,234,367.

Next, an adhesion layer 2, as for example titanium, of about 2000 Å (with a practical range of about 500 Å to about 5000 Å) is blanket deposited (as by vacuum evaporation, sputtering and the like) onto the substrate 1. This layer 2 is employed for facilitating the adhesion of a copper layer 3, of about 3 microns thick (with a typical range of about 1 micron to about 10 microns which is blanket coated over it in similar fashion, e.g. vacuum evaporation, sputtering, etc.

Next, a layer 4 of a lift-off masking material is coated over the copper film 3. This masking material is characterized as an organic polymeric material which can comprise standard photo or electron beam resists which can be applied in any convenient manner, as by spin coating. As indicated, the resist can comprise any optical or E-beam sensitive resist which preferably will comprise known radiation degradable resists, inclusive of two-coat polymethacrylate polymers, copolymeric resists and the like. Other suitable resists include synthetic resins such as polyvinyl cinnamate, diazo type resists and the like. These lift-off techniques are known, typical of which can be found described in U.S. Pat. Nos. 3,421,206; 3,873,361; 3,934,057; 3,982,943; and 4,004,044.

Figure 1C:
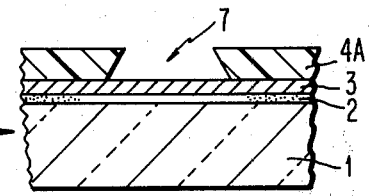
Figure 1D:
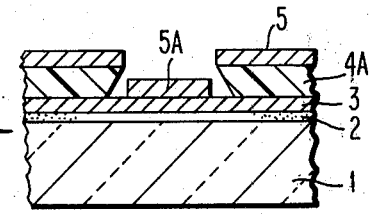

This masking material is processed into a lift-off mask 4A with a pattern of openings 7 as in FIG. 1C, by exposure and development in accordance with appropriate lithographic techniques well known in the integrated circuit fabrication art.

After the mask formation a blanket layer 5 of molybdenum is deposited by evaporation over the lift-off mask 4A and in the exposed portions of the copper film 3, as indicated by the segment 5A, which will eventually comprise part of the composite dry etch mask 8. An illustrative thickness of the molybdenum for this embodiment may be of about 2000 Å, (with a practical range of about 500 Å to about 5000 Å).

Figure 1E:
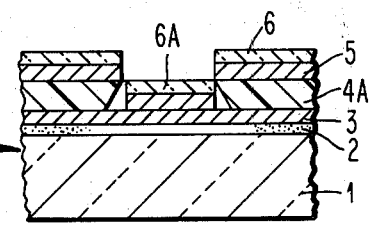

In the next operation, a layer 6 of magnesium oxide (MgO), illustratively of about 2000 A, is blanket evaporated over the Mo segments 5 and 5A, as indicated in FIG. 1E, wherein the MgO segment 6A will complete the structure of the composite dry etch mask 8.

Figure 1F:
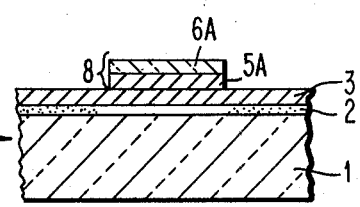
Figure 1G:
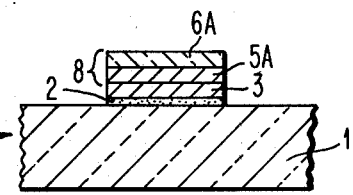
Figure 1H:
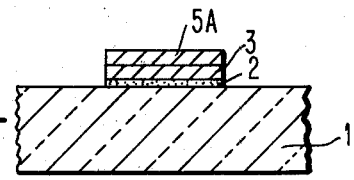
Figure 1J:
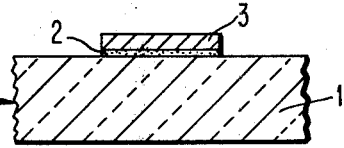

Next, utilizing conventional lift-off removal techniques, the remaining portions of the resist mask 4A are completely removed by suitable solvents or etchants which also carry away the overlying molybdenum and magnesium oxide coatings, to leave behind, on the surface of copper film 3, the molybdenum and magnesium oxide segments 5A and 6A, respectively, forming the composite dry etch mask 8, FIG. 1F. A positive resist, such as AZ1350J, can be removed by immersion in a solvent such as N-methylpyrrolidone. It is only necessary that the solvent can be one that dissolves or swells the polymeric material without affecting the Mo, MgO or Cu films. Other solvents which can be used include acetone, butylacetate, trichloroethylene, Cellosolve acetate, and the like.

Figure 2A:
FIG. 2A is a photomicrograph of a masked copper film prepared for reactive ion etching in accordance with this invention.

The Mo/MgO composite masked structure, as shown in FIGS. 1F and 2A, is then subjected to dry etching processes for removal of the exposed portions of the copper film 3 and the underlying portions of the titanium adhesion layer 2, down to the substrate 1. For example, the structure can be dry etched by reactive ion etching at 1.3 W/cm$^2$ at 13.56 MHz in a 2 mTorr CCl$_4$/8 m Torr Ar environment having a 2.5 sccm flow rate of CCl$_4$ with a cathode temperature of 225° C.

Using these conditions the structure of FIG. 2A having a 2000 Å titanium layer 2 and a 3 micron copper film 3 can be etched in 10–12 minutes. Typically, spacings of 2 microns can be obtained quite readily.

After dry etching of the structure, the MgO mask component 6A is removed in a suitable solvent or etchant, as for example by immersion for two minutes in a warm (40°–50° C.) 8 wt.% aq solution of oxalic acid. The remaining Mo component 5A of the mask is then removed in an aq solution comprised of 92 g.K$_3$[Fe(CN)$_6$], 20 gKOH and 300 ml H$_2$O which is followed by rinsing in H$_2$O.

Figure 2B:
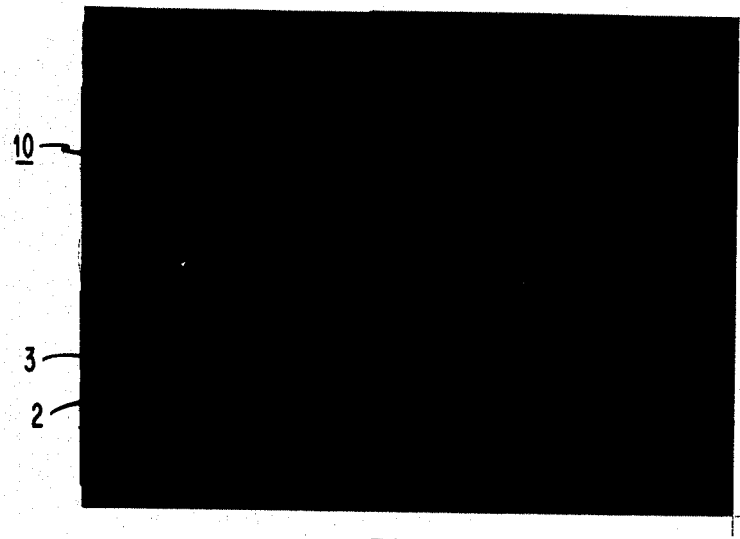
FIG. 2B is a photomicrograph of the structure of FIG. 2A after reactive ion etching in accordance with this invention.

Removing of the Mo/oxide mask 8 leaves the masked portions of the copper film 3 (and the underlying portions of titanium 2) in the desired pattern configuration 10, as shown in FIG. 2B.

While the invention has been illustrated and described with respect to preferred embodiments thereof, it is to be understood that the invention is not to be limited to the precise construction herein disclosed, and the right is reserved to all changes and modifications coming within the scope of the invention as defined in the appended claims.

Having thus described the invention, what is claimed as new and desired to be secured by Letters Patent is:

1. A process for forming a copper based metal pattern comprising
   depositing on a copper surface a composite mask formed by sequentially depositing of a diffusion barrier layer of molybdenum and an overlying layer selected from the group consisting of magnesium oxide (MgO) and aluminum oxide (Al$_2$O$_3$) extending in a pattern corresponding to the desired configuration of said copper pattern, with openings exposing complementary portions of said copper surface,
   dry etch removal of said complementary portions of said copper through said mask openings, and
   removing said composite mask.

2. The process of claim 1 wherein said exposed copper portions are removed by reactive ion etching.

3. The process of claim 1 wherein said copper is formed as a film on the surface of a glass-ceramic structure.

4. The process of claim 3 wherein said exposed copper surface portions are removed by dry etching.

5. The process of claim 3 wherein said exposed copper portions are removed by reactive ion etching.

6. The process of claim 5 wherein said etching is effected in a CCl$_4$/Ar atmosphere.

7. The process of claim 3 including the formation of an adhesion promoting film between said copper and said glass-ceramic surface.

8. The process of claim 7 wherein said adhesion promoting film comprises titanium.

9. The process of claim 8 wherein said exposed copper portions are removed by reactive ion etching.

10. The process of claim 9 wherein said etching is effected in a CCl$_4$/Ar atmosphere.

11. A process for forming a patterned copper metallization on a substrate, comprising:
   (A) blanket coating said substrate with a copper film;
   (B) forming a lift-off mask on said copper film, with said mask having opening corresponding to the desired copper pattern;
   (C) blanket depositing a diffusion barrier film of molybdenum on the portions of said copper film exposed by said lift-off mask opening as a component of a composite dry etch mask;

(D) blanket depositing a second film, selected from the group consisting of MgO and $Al_2O_3$ on said molybdenum film through said mask openings as a second component of a composite dry etch mask;

(E) removing said lift-off mask to retain the deposited said film components of said composite dry etch mask extending in a configuration corresponding to said copper pattern while exposing complementary portions of said copper film;

(F) dry etching said complementary of said copper film in a plasma ambient, and (G) removing the said film components of said composite dry etch mask.

12. The process of claim 11 wherein said plasma ambient is comprised of $CCl_4$ and Ar.

13. The process of claim 11 wherein said dry etching comprises reactive ion etching.

14. The process of claim 13 wherein said plasma ambient is comprised of $CCl_4$ and Ar.

15. The process of claim 11 wherein said substrate comprises a glass-ceramic structure.

16. The process of claim 15 wherein said plasma ambient is comprised of $CCl_4$ and Ar.

17. The process of claim 15 wherein said dry etching comprises reactive ion etching.

18. The process of claim 17 wherein said plasma ambient is comprised of $CCl_4$ and Ar.

19. The process of claim 15 including the deposition of a blanket coating of titanium adhesion promoting layer between said copper film and said glass ceramic structure.

20. The process of claim 19 wherein said plasma ambient is comprised of $CCl_4$ and Ar.

21. The process of claim 19 wherein said dry etching comprises reactive ion etching.

22. The process of claim 21 wherein said plasma ambient is comprised of $CCl_4$ and Ar.

23. A process for forming a patterned copper metallization on a substrate comprising:

(A) blanket coating said substrate with a copper first film, (B) blanket coating said copper film with a diffusion barrier molybdenum second film, (C) blanket coating second film with a third film selected from the group consisting of MgO and $Al_2O_3$ films, (D) blanket coating said film with a resist fourth film, (E) lithographically forming a mask from said resist having a pattern of openings complementary to the desired copper pattern, (F) removing the portions of said MgO film and the underlying portions of said Mo film in said openings to expose the underlying portions of said copper film, (G) removing the remaining portions of said resist of said mask to retain a composite mask of said Mo and MgO films, extending in a configuration corresponding to said copper pattern, (H) dry etching said exposed portions of said copper film in a plasma ambient through said openings of said composite mask, and (I) removing the remaining MgO and Mo film portions of said composite mask.

24. The process of claim 23 wherein said plasma ambient is comprised of $CCl_4$ and Ar.

25. The process of claim 23 wherein said dry etching comprises reactive ion etching.

26. The process of claim 25 wherein said plasma ambient is comprised of $CCl_4$ and Ar.

27. The process of claim 23 wherein said substrate comprises a glass-ceramic structure.

28. The process of claim 27 wherein said plasma ambient is comprised of $CCl_4$ and Ar.

29. The process of claim 27 wherein said dry etching comprises reactive ion etching.

30. The process of claim 29 wherein said plasma ambient is comprised of $CCl_4$ and Ar.

31. The process of claim 27 including the deposition of a blanket coating of titanium adhesion promoting layer between said copper film and said glass ceramic structure.

32. The process of claim 31 wherein said plasma ambient is comprised of $CCl_4$ and Ar.

33. The process of claim 31 wherein said dry etching comprises reactive ion etching.

34. The process of claim 33 wherein said plasma ambient is comprised of $CCl_4$ and Ar.

* * * * *